(12) United States Patent
Simon

(10) Patent No.: US 9,217,809 B2
(45) Date of Patent: Dec. 22, 2015

(54) ANTENNA OF AN ELECTROMAGNETIC PROBE FOR INVESTIGATING GEOLOGICAL FORMATIONS

(75) Inventor: Matthieu Simon, Princeton, NJ (US)

(73) Assignee: Schlumberger Technology Corporation, Sugar Land, TX (US)

( * ) Notice: Subject to any disclaimer, the term of this patent is extended or adjusted under 35 U.S.C. 154(b) by 1447 days.

(21) Appl. No.: 12/524,631

(22) PCT Filed: Jan. 21, 2008

(86) PCT No.: PCT/EP2008/000611
§ 371 (c)(1),
(2), (4) Date: Nov. 5, 2009

(87) PCT Pub. No.: WO2008/095619
PCT Pub. Date: Aug. 14, 2008

(65) Prior Publication Data
US 2013/0176030 A1   Jul. 11, 2013

(30) Foreign Application Priority Data

Feb. 6, 2007 (EP) ...................................... 07290149

(51) Int. Cl.
G01V 3/00 (2006.01)
G01V 3/30 (2006.01)
G01R 27/02 (2006.01)
G01V 3/28 (2006.01)

(52) U.S. Cl.
CPC ......... *G01V 3/30* (2013.01); *G01R 27/02* (2013.01); *G01V 3/28* (2013.01)

(58) Field of Classification Search
CPC ............. G01V 3/28; G01V 3/30; G01V 3/26; G01V 3/24; G01V 3/38; G01V 3/18; G01V 3/101; G01V 3/12

USPC .......................... 324/323–375; 250/253–266; 166/244.1–403; 343/703, 709, 343/718–719

See application file for complete search history.

(56) References Cited

U.S. PATENT DOCUMENTS 2,672,818 A * 3/1954 Adams et al. ................... 417/12
3,849,721 A   11/1974 Chalvert
3,944,910 A   3/1976 Rau
3,967,201 A * 6/1976 Rorden ....................... 340/854.5
4,078,237 A * 3/1978 Kaloi ........................ 343/700 MS
4,107,598 A * 8/1978 Meador et al. ................ 324/341
4,704,581 A * 11/1987 Clark ............................ 324/341

(Continued)

FOREIGN PATENT DOCUMENTS

EP   1693685       8/2006
WO   2008/031505   3/2008

*Primary Examiner* — Huy Q Phan
*Assistant Examiner* — Thang Le
(74) *Attorney, Agent, or Firm* — Stephanie Chi; Jody Lynn DeStefanis

(57) ABSTRACT

An antenna 3 of an electromagnetic probe used in investigation of geological formations GF surrounding a borehole WBH comprises a conductive base 31 and an antenna element 32. The conductive base 31 comprises an opened non-resonant cavity 33. The antenna element 32 is embedded in the cavity 33 and goes right through the cavity. The antenna element 32 is isolated from the conductive base 31. The antenna element 32 is coupled to at least one electronic module via a first 34A and a second 34B port, respectively. The electronic module operates the antenna so as to define either a substantially pure magnetic dipole, or a substantially pure electric dipole.

16 Claims, 12 Drawing Sheets

(56) References Cited

U.S. PATENT DOCUMENTS

| | | | |
|---|---|---|---|
| 4,774,470 A | 9/1988 | Takigawa et al. | |
| 5,029,468 A * | 7/1991 | Dosjoub | 73/146.5 |
| 5,233,304 A * | 8/1993 | Hubans | 324/323 |
| 5,345,179 A | 9/1994 | Habashy et al. | |
| 5,434,507 A | 7/1995 | Beren et al. | |
| 5,677,631 A * | 10/1997 | Reittinger et al. | 324/324 |
| 6,614,229 B1 * | 9/2003 | Clark et al. | 324/338 |
| 6,777,940 B2 * | 8/2004 | Macune | 324/338 |
| 7,098,858 B2 * | 8/2006 | Bittar et al. | 343/719 |
| 7,242,188 B1 * | 7/2007 | Johnson et al. | 324/251 |
| 7,482,812 B2 * | 1/2009 | Moore | 324/338 |
| 2003/0011371 A1 * | 1/2003 | Rosthal et al. | 324/338 |
| 2003/0016020 A1 * | 1/2003 | Gianzero | 324/342 |
| 2003/0117142 A1 * | 6/2003 | Amini | 324/339 |
| 2005/0030021 A1 * | 2/2005 | Prammer et al. | 324/303 |
| 2005/0046424 A1 * | 3/2005 | Sinclair et al. | 324/338 |
| 2005/0062665 A1 | 3/2005 | du Toit et al. | |
| 2005/0146334 A1 * | 7/2005 | Chen et al. | 324/338 |
| 2005/0189945 A1 * | 9/2005 | Reiderman | 324/333 |
| 2006/0103389 A1 * | 5/2006 | Bespalov et al. | 324/338 |
| 2006/0145700 A1 | 7/2006 | Tabanou et al. | |
| 2007/0199515 A1 * | 8/2007 | Cheron et al. | 119/220 |
| 2008/0297160 A1 * | 12/2008 | Forgang et al. | 324/339 |

* cited by examiner

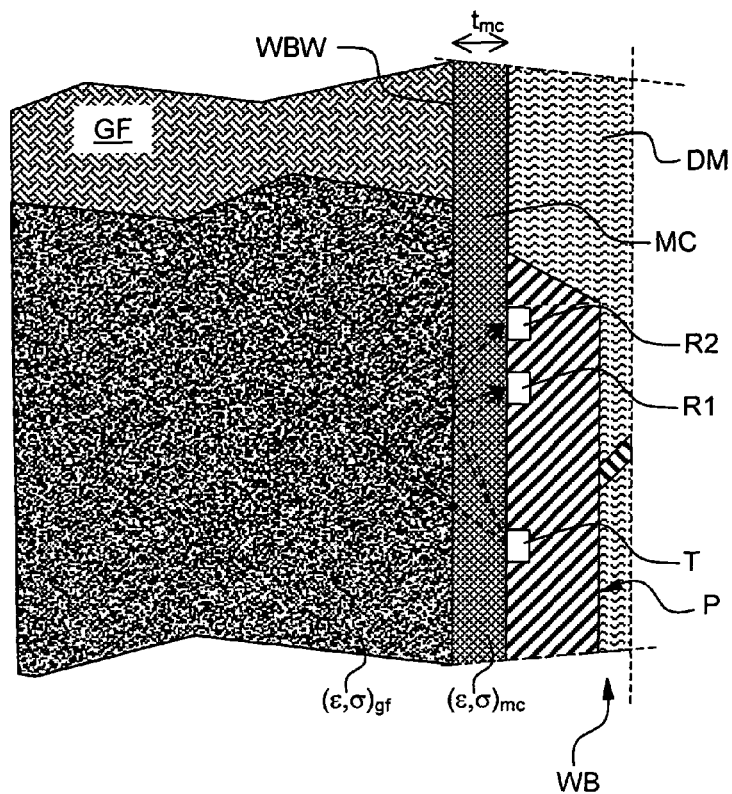
FIG. 2 - PRIOR ART
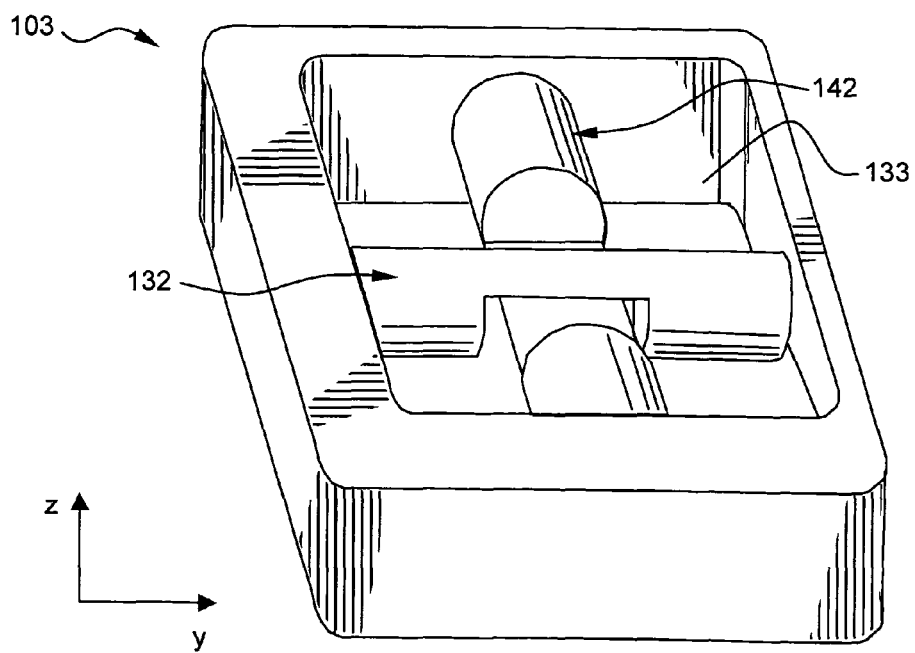
FIG. 3 - PRIOR ART

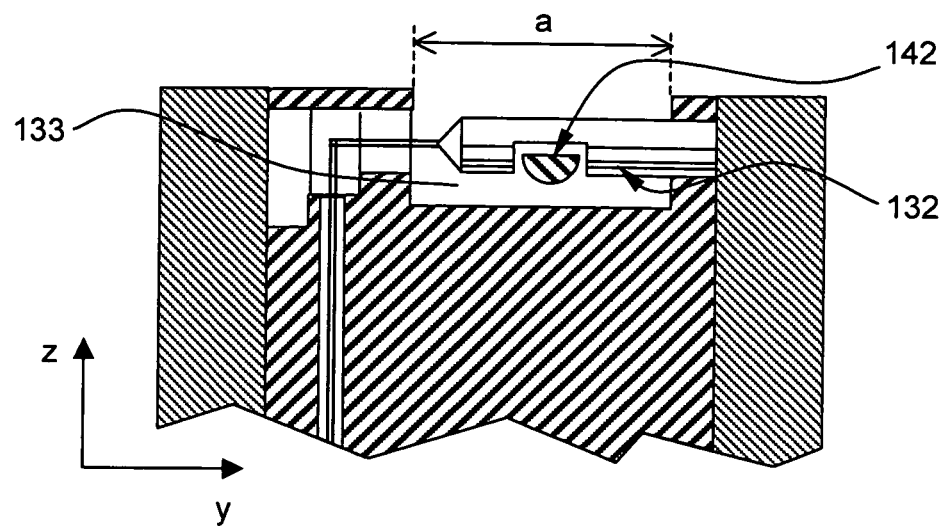
FIG. 4 - PRIOR ART
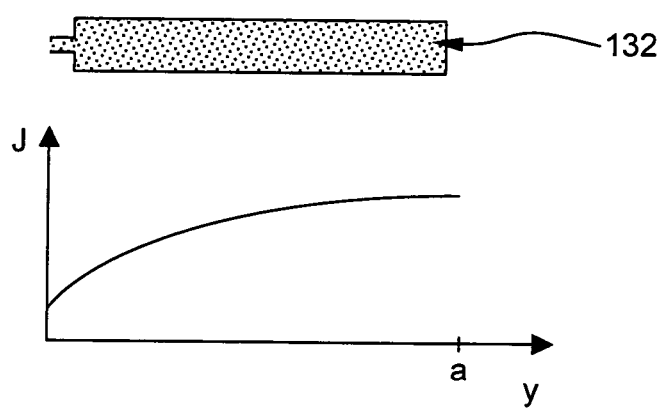
FIG. 5 - PRIOR ART

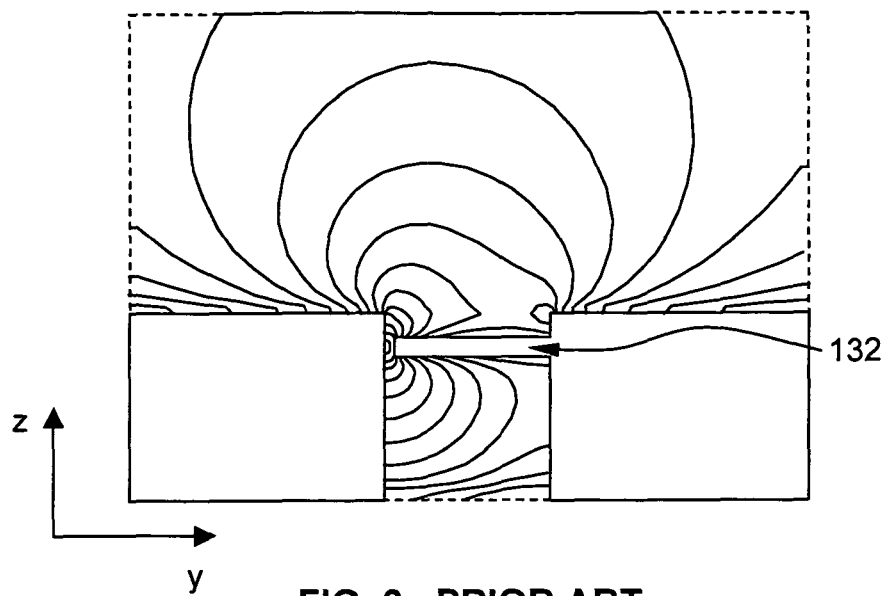
FIG. 6 - PRIOR ART
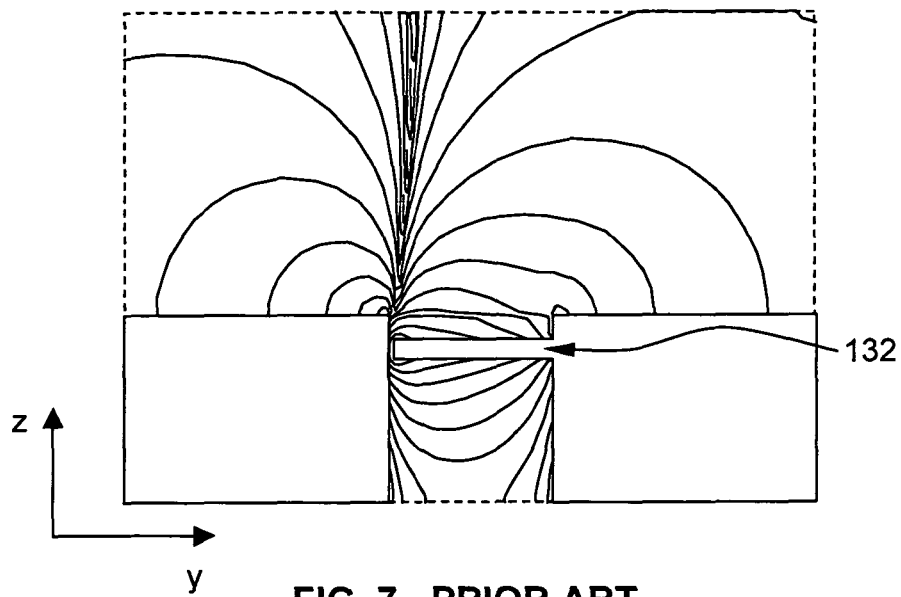
FIG. 7 - PRIOR ART

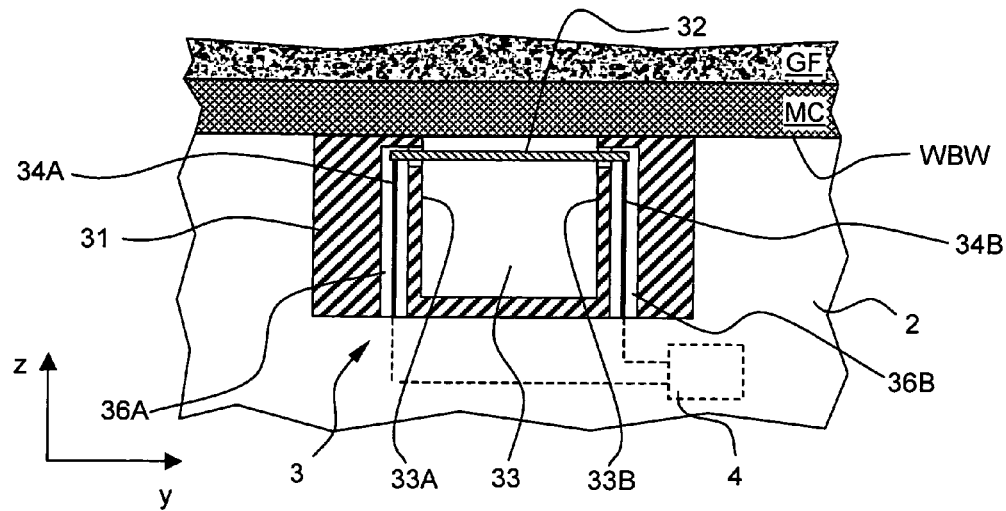
Figure 10
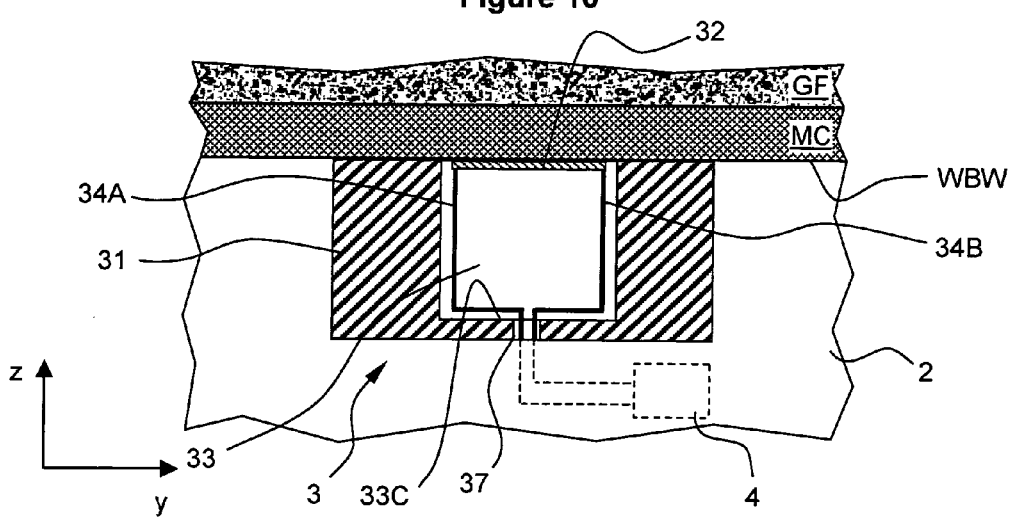
Figure 11
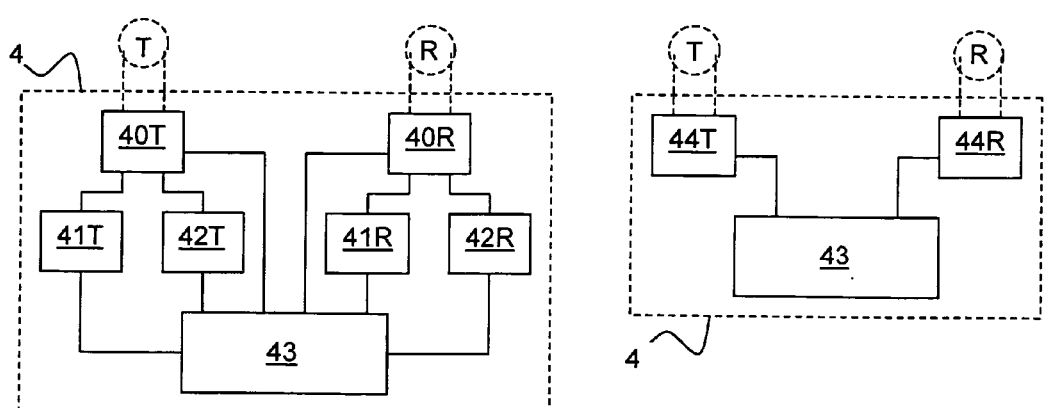
Figure 12A
Figure 12B

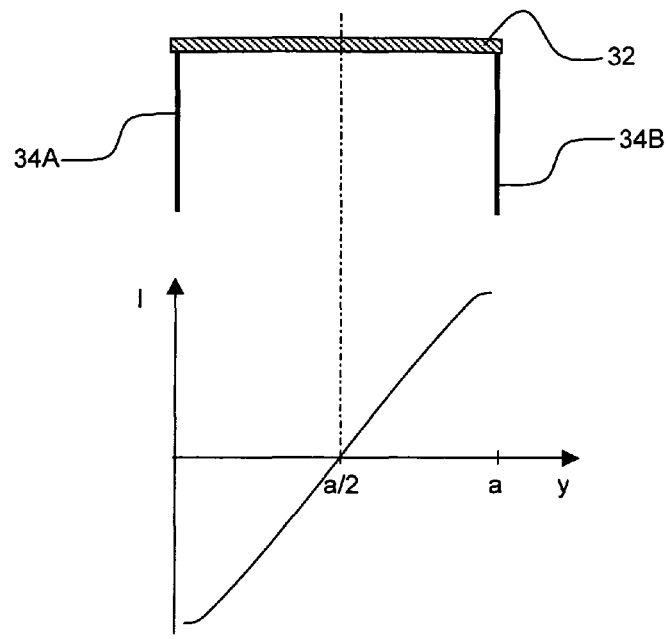
Figure 15
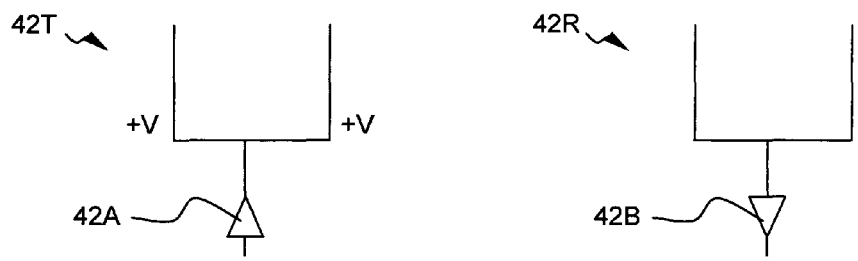
Figure 16A                    Figure 16B
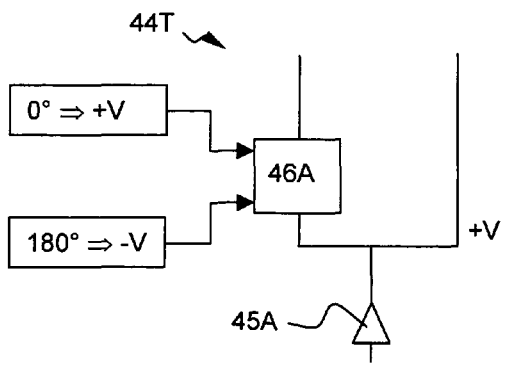 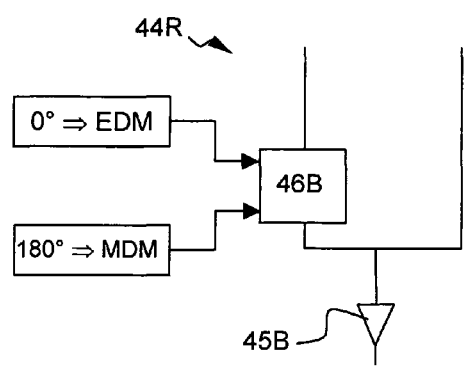
Figure 16C                    Figure 16D

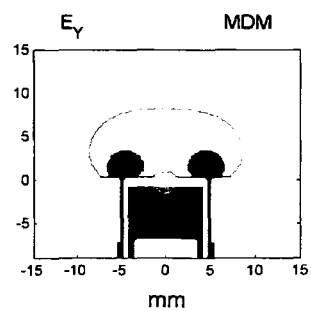
Figure 17
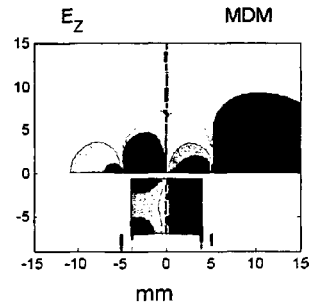
Figure 18
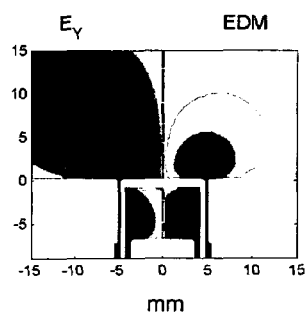
Figure 19
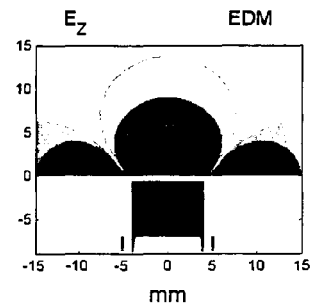
Figure 20
| Antenna Mode | Ru | Tu | Td | Rd |
|---|---|---|---|---|
| MDM | → | → | → | → |
| EDM | ⊙ | ⊙ | ⊙ | ⊙ |
| CFM | → | ⊙ | ⊙ | → |
Figure 21

ANTENNA OF AN ELECTROMAGNETIC PROBE FOR INVESTIGATING GEOLOGICAL FORMATIONS

FIELD OF THE INVENTION

The invention relates to an antenna of an electromagnetic probe for measuring the electromagnetic properties of a subsurface formation in a limited zone surrounding a borehole. Another aspect of the invention relates to a logging tool for performing logs of subsurface formation bore hole. A particular application of the probe and the logging tool according to the invention relates to the oilfield services industry.

BACKGROUND OF THE INVENTION

Logging devices that measure formation electromagnetic properties (e.g. dielectric constant) are known, for example from U.S. Pat. No. 3,849,721, U.S. Pat. No. 3,944,910 and U.S. Pat. No. 5,434,507. FIG. 2 illustrates a logging device including a transmitter T and spaced receivers R1, R2 mounted in a pad P that is urged against a borehole wall WBW of a well bore WB filled with drilling mud DM. Microwave electromagnetic energy (illustrated by dotted lines) is transmitted into the formations, and energy that has propagated through the formations is received at the receiving antennas. The phase and amplitude of the energy propagating in the formation is determined from the receiver output signals. The dielectric constant and the conductivity of the formations can then be obtained from the phase and amplitude measurements.

The transmitters and receivers comprise antennas that are assimilated to magnetic dipoles. These dipoles are tangential to the pad face and are orientated in different directions. A broadside mode corresponds to the dipoles oriented orthogonally to the pad-axis. An endfire mode corresponds to the dipoles oriented in alignment with the pad axis. The depth of investigation for the broadside mode is very poor. The investigation depth for the endfire mode is greater than for the broadside mode, but the signal is usually weaker, for example at 1 GHz. The attenuation and phase-shift are measured between the two receivers. A simple inversion allows in case of a homogeneous formation to retrieve the dielectric constant and the conductivity. Typically, such a logging device is unable to provide an accurate measurement of the formation properties because of its high sensitivity to the standoff of the pad relatively to the formation or the presence of a mudcake on the borehole wall. For example, in the presence of a mudcake layer MC the number of unknowns increase from two unknown, namely the permittivity $\in$ and the conductivity $\sigma$ of the formation GF ($\in$, $\sigma$)$_{gf}$ to five unknowns, namely the permittivity $\in$ and the conductivity $\sigma$ of the formation ($\in$, $\sigma$)$_{gf}$ and of the mudcake MC ($\in$, $\sigma$)$_{mc}$, and the mudcake thickness $t_{mc}$. Consequently, accurate determination of the formation electromagnetic properties based on the attenuation and phase-shift measurements is not possible.

The document U.S. Pat. No. 5,345,179 proposes a solution to improve the logging device response and accuracy in the presence of a mudcake. The logging device comprises a plurality of cross-dipole antennas, each being located in a cavity. The cross-dipole antenna houses both endfire and broadside polarizations in the same cavity.

FIGS. 3 and 4 are perspective and cross-section views schematically showing a cross dipole antenna according to the prior art. Typically, such a cross dipole antenna 103 comprises two wires 132, 142 embedded in a non-resonant cavity 133 filled with a dielectric material and short-circuited to the conductive cavity wall at one end.

FIG. 5 illustrates the current distribution for a cross dipole antenna according to the prior art. The current distribution J is approximated from the analogy with a short-circuited transmission line. The current distribution on the radiating wire in the cavity can be approximated to:

$$J(\gamma) = J_0 \cos(k_0[\gamma - a])$$

where:
$J_0$ is the current amplitude,
a is the aperture size,
$k_0$ is the wave number in the cavity and is equal to:

$$k_0 = \frac{\omega}{c} \sqrt{\varepsilon_{cavity}},$$

$\in_{cavity}$ is the relative dielectric constant of the material filling the cavity,
$\omega$ is the angular frequency, and
c is the speed of light in vacuum.

The current is maximal at the short-circuit location. This cosinusoidal and asymmetric current distribution excites a strong, parasitic electric dipole.

FIGS. 6 and 7 illustrate the electromagnetic field components Ey and Ez in the yz plane of a cross dipole antenna 103 (more precisely of the radiating wire) of the prior art, respectively.

The current flowing on the wire, for example wire 132, excites modes in the cavity. The dominant mode is the transverse electric mode $TE_{10}$. This mode contributes to a radiation pattern, which is close to a magnetic point dipole m orthogonal to the wire. The current distribution on the wire will also excite parasitic modes, the dominant one being the transverse magnetic mode $TM_{11}$. This mode corresponds to an electric dipole p normal to the aperture. These parasitic modes cause a strong asymmetry of the electromagnetic field Ey and Ez in the yz plane.

The antennas of the prior art are far from being pure magnetic dipoles. In particular, the parasitic electric dipole, normal to the aperture affects the measurement accuracy. Further, as the mudcake electromagnetic properties are not determined, the inversion calculation for determining the geological formation electromagnetic properties may not be robust.

SUMMARY OF THE INVENTION

One goal of the invention is to propose an antenna and an electromagnetic probe comprising at least one of such an antenna enabling measurement of the electromagnetic properties of a subsurface formation in a limited zone surrounding a borehole avoiding, at least reducing the drawbacks of the prior art antennas and probes.

According to a first aspect, the invention relates to an antenna combining an antenna element having a simple mechanical design with an appropriate electronic circuit determining the behavior of the antenna either as a substantially pure electric dipole or a substantially pure magnetic dipole.

More precisely, the first aspect of the present invention relates to an antenna of an electromagnetic probe used in investigation of geological formations surrounding a borehole comprising a conductive base and an antenna element, the conductive base comprising an opened non-resonant cavity, the antenna element being embedded in the cavity and going right through the cavity, the antenna element being isolated from the conductive base, the antenna element being coupled to at least one electronic module via a first and a second port, respectively, the electronic module operating the antenna so as to define either a substantially pure magnetic dipole, or a substantially pure electric dipole.

Advantageously, the antenna element may be a wire strip.

The cavity may have a parallelepipedic or a cylindrical shape. The cavity may be filled with a dielectric material.

The electronic module may comprise a first electronic module operating the antenna so as to define a substantially pure magnetic dipole, the first electronic module comprising an amplifier connected to a transformer, the transformer comprising a secondary having a center connected to a ground, the secondary being connected to the ports of the antenna element.

The electronic module may further comprise a second electronic module operating the antenna so as to define a substantially pure electric dipole, the second electronic module comprising an amplifier, the amplifier being connected to the ports of the antenna element.

Alternatively, the electronic module may comprise an amplifier connected to a phase-shifter, the phase-shifter being connected to a port of the antenna, the amplifier being also connected to the other port of the antenna element.

Advantageously, the amplifier is a power amplifier for an electronic module operating as a transmitter and a low noise amplifier for an electronic module operating as a receiver.

Still another aspect of the invention relates to antenna module comprising an antenna of an electromagnetic probe according to the invention. The conductive base may further comprise a printed circuit board coupled to the antenna by means of the ports, the printed circuit board comprising the at least one electronic module and a control and processing module.

Another aspect of the invention relates to an electromagnetic logging apparatus used in investigation of geological formations surrounding a borehole, comprising:
- a logging tool moveable through the borehole,
- an electromagnetic probe comprising a pad mounted on the logging device, adapted for engagement with the borehole wall by a wall-engaging face of the pad,
- at least one antenna mounted in the wall-engaging face and used as a transmitting antenna,
- a plurality of spaced antennas mounted in the wall-engaging face and used as receiving antennas positioned in spaced relation to the transmitting antenna,
- a transmitter module adapted for energizing the transmitting antenna to transmit electromagnetic energy into the formations at a determined frequency, and
- a receiver module adapted for receiving and processing an output signal at each of the receiving antennas representative of electromagnetic energy received from the formations, wherein at least one of the receiving or transmitting antennas is an antenna according to the invention.

A further aspect of the present invention relates to a method of investigation of geological formations surrounding a borehole using an electromagnetic logging apparatus comprising at least one transmitting antenna and at least one receiving antenna according to the invention, wherein the method comprises the steps of:

a) running the logging apparatus through the borehole and engaging a pad with a borehole wall so as to define a selected zone made of a medium to be investigated, b) performing a first set of measurements at a deep radial depth of investigation in the selected zone by:
   b1) operating the antennas so that each antenna defines a substantially pure magnetic dipole, and radiating electromagnetic signals in the medium,
   b2) measuring a first set of attenuation and phase shift of the electromagnetic signals having traveled in the medium between the transmitting and receiving antennas, c) performing a second set of measurements at a shallow radial depth of investigation in the selected zone by:
   c1) operating the antennas so as each antenna defines a substantially pure electric dipole,
   c2) radiating electromagnetic signals into the formation surrounding the borehole and measuring a first sub-set of attenuation and phase shift of the electromagnetic signals having traveled in the formation between the transmitting and receiving antennas,
   c3) radiating electromagnetic signals into the formation surrounding the borehole and measuring a second sub-set of magnitude and phase of the electromagnetic signals reflected by the formation at a transmitting antenna input, and d) performing an inversion calculation based on the first and second set of measurements and determining the permittivity $\in$ and the conductivity $\sigma$ of the in the selected zone.

The medium may be the geological formation covered by a mudcake. The step d) may comprise performing an inversion calculation based on the first and second set of measurements and determining the permittivity $\in$ and the conductivity $\sigma$ of the formation, the permittivity $\in$, the conductivity $\sigma$ and thickness $t_{mc}$ of the mudcake.

The selected zone may comprise at least one geological feature. The geological feature may be a laminate, a fracture, a bed boundary or a vug. The method may further comprise the steps of:
- operating the transmitting antennas so that each transmitting antenna defines a substantially pure electric dipole,
- operating the receiving antennas so that each receiving antenna defines a substantially pure magnetic dipole,
- radiating electromagnetic signals in the selected zone,
- measuring the attenuation and phase shift of the electromagnetic signals having traveled in the formation between the transmitting and receiving antennas, and
- deducing the geological feature in the selected zone based on the attenuation and phase shift.

Conversely, the transmitting antennas may be operated so that each transmitting antenna defines a substantially pure magnetic dipole, while the receiving antennas may be operated so that each receiving antenna defines a substantially pure electric dipole.

The antenna for an electromagnetic probe of the invention used in geological surveys enables a better measurement accuracy of the formations electromagnetic properties than the antenna of the electromagnetic propagation tool as described in the prior art. In particular, with the invention, it is possible to perform accurate measurement even if a mudcake covers the well bore wall, and whatever the nature of the mudcake (e.g. oil-based-mud or water-based-mud).

BRIEF DESCRIPTION OF THE DRAWINGS

The present invention is illustrated by way of examples and not limited to the accompanying figures, in which like references indicate similar elements:

FIG. 2 schematically shows a pad according to the prior art positioned into a borehole and contacting a mudcake formed onto the borehole wall;

FIG. 3 is a perspective view schematically showing in greater details a cross dipole antenna of the pad of FIG. 2 according to the prior art;

FIG. 4 is a cross-section view schematically showing in greater details a cross dipole antenna according to the prior art;

FIG. 5 illustrates the current distribution for a cross dipole antenna according to the prior art;

FIGS. 6 and 7 illustrate the electromagnetic field Ey in yz plane and Ez in yz plane of a cross dipole antenna according to the prior art, respectively;

FIGS. 10 and 11 are cross-section views schematically showing antennas according to a second and a third embodiment of the invention, respectively;

FIGS. 12A, 12B schematically show in greater details a first and a second embodiment of the electronic module shown in FIGS. 8 to 11, respectively;

FIG. 15 illustrates the current distribution for an antenna according to the invention operating into a substantially pure electric dipole mode;

FIGS. 16A and 16B illustrate a first embodiment of a transmitting and a receiving circuit for an antenna according to the invention operating into a substantially pure electric dipole mode, respectively;

FIGS. 16C and 16D illustrate a second embodiment of a transmitting and a receiving circuit for an antenna according to the invention, respectively, the circuits being adapted to operate the antenna into either a substantially pure magnetic dipole mode or a substantially pure electric dipole mode;

FIGS. 17 and 18 illustrate the electromagnetic field Ey in the yz plane and Ez in the yz plane of an antenna according to the invention operating into the substantially pure magnetic dipole mode, respectively;

FIGS. 19 and 20 illustrate the electromagnetic field Ey in the yz plane and Ez in the yz plane of an antenna according to the invention operating into the substantially pure electric dipole mode, respectively;

FIG. 21 is a table illustrating different modes of operation performed with the antenna of the invention;

DETAILED DESCRIPTION OF THE INVENTION

Figure 1:
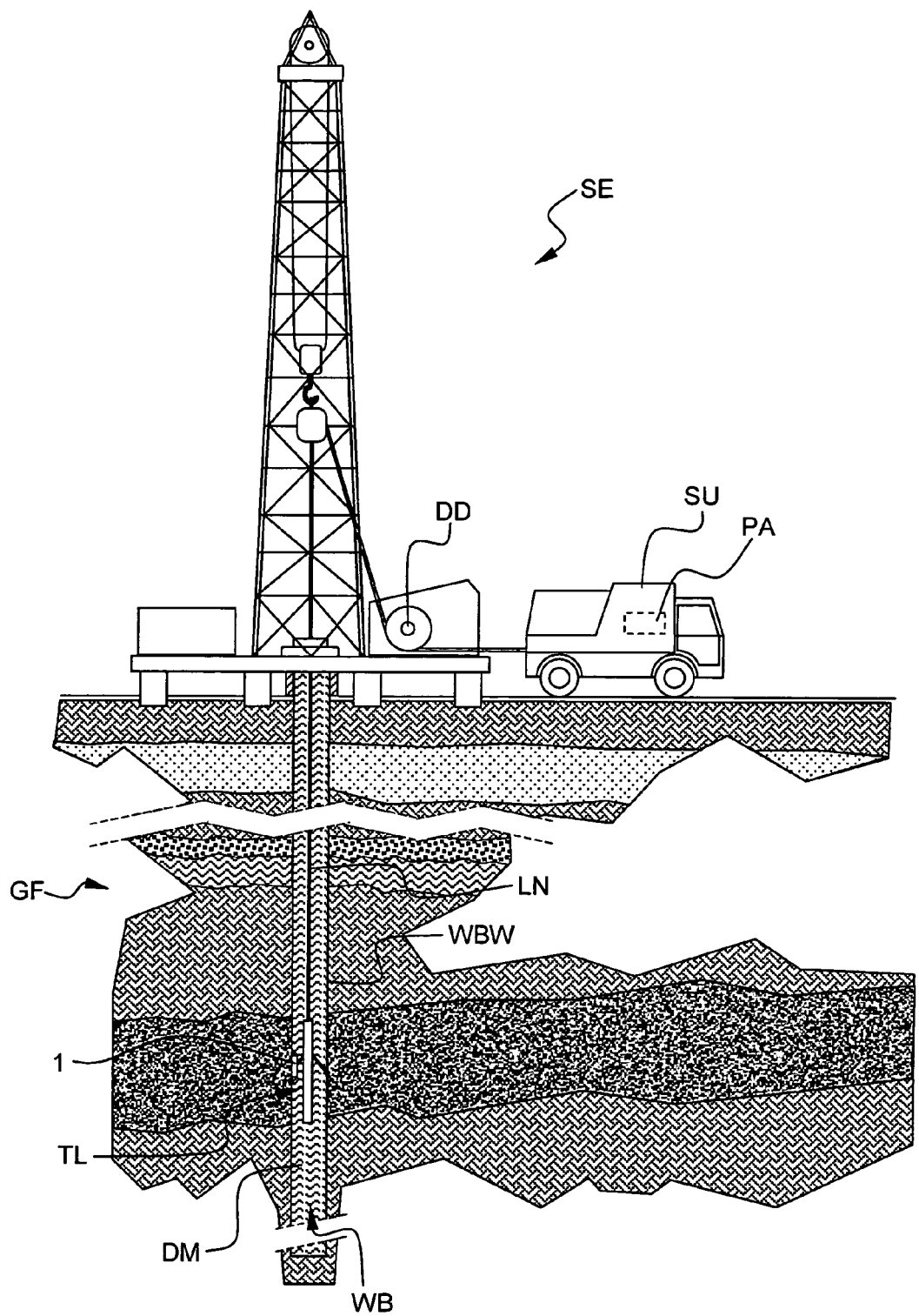
FIG. 1 schematically illustrates a typical onshore hydrocarbon well location.

FIG. 1 schematically shows a typical onshore hydrocarbon well location and surface equipments SE above a hydrocarbon geological formation GF after drilling operations have been carried out. At this stage, i.e. before a casing string is run and before cementing operations are carried out, the wellbore is a borehole WB filled with a fluid mixture DM. The fluid mixture DM is typically a mixture of drilling fluid and drilling mud. In this example, the surface equipments SE comprise an oil rig and a surface unit SU for deploying a logging tool TL in the well-bore. The surface unit may be a vehicle coupled to the logging tool by a line LN. Further, the surface unit comprises an appropriate device DD for determining the depth position of the logging tool relatively to the surface level. The logging tool TL comprises various sensors and provides various measurement data related to the hydrocarbon geological formation GF and/or the fluid mixture DM. These measurement data are collected by the logging tool TL and transmitted to the surface unit SU. The surface unit SU comprises appropriate electronic and software arrangements PA for processing, analyzing and storing the measurement data provided by the logging tool TL.

The logging tool TL comprises a probe 1 for measuring the electromagnetic properties of a subsurface formation according to the invention. Once the logging tool is positioned at a desired depth, the probe 1 can be deployed from the logging tool TL against the borehole wall WBW by an appropriate deploying arrangement, for example an arm.

Figure 8:
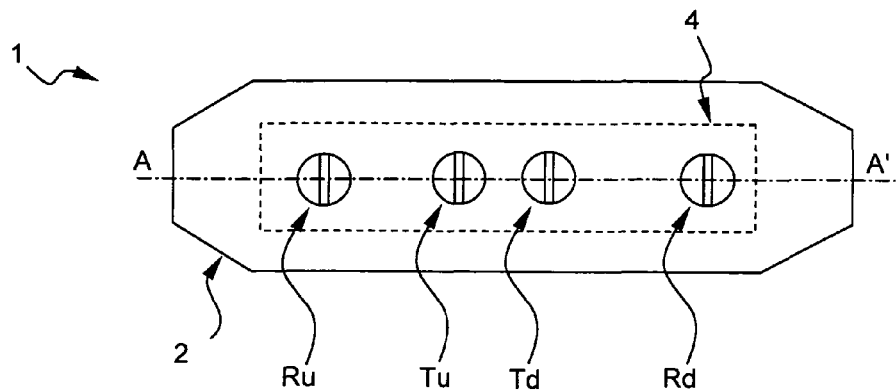
FIG. 8 schematically shows a borehole wall contacting side view of a pad for measuring the electromagnetic properties of a subsurface formation comprising antennas according to the invention.

FIG. 8 schematically shows a well-bore wall contacting face view of the probe 1. The probe 1 comprises a pad 2. The pad is a conductive metal housing, for example made in a metallic material like stainless steel arranged to be positioned in contact with a well-bore wall WBW. The pad 2 is coupled to the tool TL by an arm (not shown). The arm enables the deployment of the pad 2 into the borehole WB against the well-bore wall WBW.

The probe 1 further comprises transmitting and receiving antennas, for example two transmitting antennas Tu and Td, and two receiving antennas Ru and Rd. The transmitting antennas Tu and Td and the receiving antennas Ru and Rd are positioned in the pad along a line AA' in the pad face arranged to be positioned in contact with the well-bore wall WBW. The number of the transmitting and receiving antennas, and their positions relatively to each other, as illustrated in FIG. 8, is only an example. The number and positions of the transmitting and receiving antennas may be different. Also, in the present description, each antenna is either always used as a transmitting antenna or always used as a receiving antenna. Nevertheless, an antenna is not limited to a specific function;

each antenna may be used as receiving antenna and subsequently as transmitting antenna, or vice-versa by means of a switch for connecting the antenna to the appropriate electronic module (transmitter module or receiver module).

The probe 1 further comprises an electronic arrangement 4 connected to the transmitting and receiving antennas. Typically, the electronic arrangement 4 is designed such that the antenna may operate in a frequency range from around 10 MHz to around 2 GHz. The electronic arrangement 4 comprises at least one transmitter module and at least one receiver module. Each transmitter module is arranged to excite the transmitting antennas Tu and/or Td by applying an excitation signal. Each receiver module is arranged to determine an attenuation and a phase shift of a reception signal provided by the receiving antenna Ru and Rd relatively to the excitation signal.

Additionally, the electromagnetic probe 1 may comprise other type of sensors (not shown), for example a temperature sensor, for measuring characteristic parameters of the fluid mixture, the mudcake, and/or the formation.

One or more coaxial cables (not shown) may be run though the arm for connecting the electronic arrangement 4 with the tool TL. The tool TL contains the bulk of the down-hole electronics (not shown) and provides energy and control commands, and gathers measurements from the electromagnetic probe 1. Alternatively, the electronic arrangement 4 may comprise a data communication module (not shown) for directly transmitting measurements to the surface equipment SE and receiving control commands from it.

FIGS. 9A, 9B, 10 and 11 schematically show an antenna 3 according to different embodiments of the invention. The antenna 3 that will be described hereinafter according to the different embodiments may be used as a transmitting antenna (e.g. the transmitting antennas Tu, Td of FIG. 8) or as a receiving antenna (e.g. the receiving antennas Ru, Rd of FIG. 8).

Figure 9A:
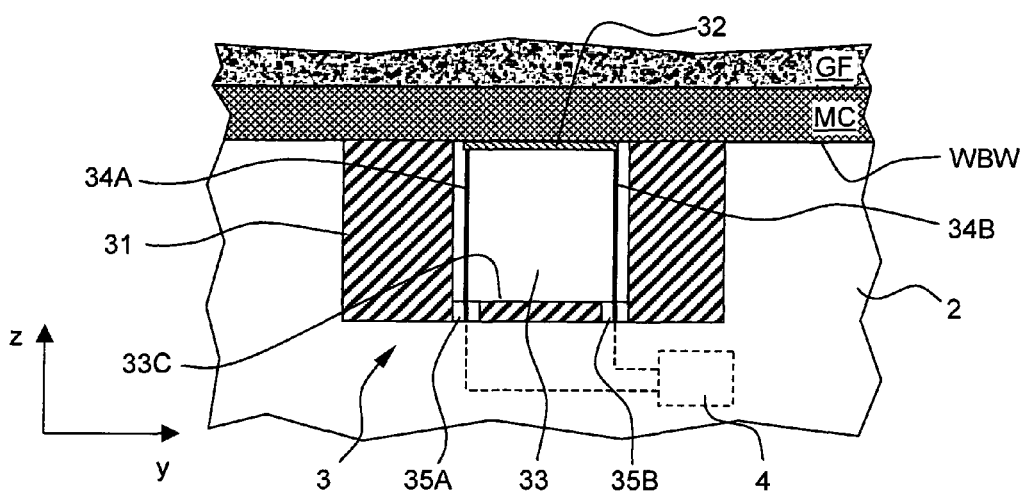
FIGS. 9A and 9B are a cross-section view and a partial perspective and cross-section view showing an antenna according to a first embodiment of the invention, respectively.

In FIGS. 9A, 10 and 11, the antenna is shown fitted into the pad 2, while the pad contacts the well-bore wall WBW. Typically, as in this example, the medium which is investigated consists in the formation GF covered by a mudcake MC. The mudcake MC is formed on the wellbore wall WBW by the screening of the particles of mud suspended into the fluid mixture when the fluid mixture invades the formation GF.

The antenna 3 comprises a conductive base 31 and a first antenna element 32. The conductive base 31 comprises an open, non-resonant cavity 33.

The cavity 33 has a cylindrical shape. Nevertheless, the cavity 33 may have other shapes, for example a parallelepipedic shape (not shown). As example, the aperture size a defined by such a cavity may be around 10 mm. Advantageously, the cavity is filled with a dielectric material. Any dielectric material may be used as the dielectric constant of said material filling the cavity has no impact on the radiation purity. Alternatively, an element in a ferrite material (not shown) may be inserted into the cavity. The ferrite material increases the magnetic dipole moment, while not changing the electric dipole moment.

The antenna element 32 goes right through the cavity while not contacting the cavity walls. The antenna element 32 is coupled to the electronic arrangement 4 by means of a first 34A and second 34B port. The port comprises a connection wire. Advantageously, the antenna element 32 is coupled at the first 34A and second 34B port at each of its ends.

Advantageously, the antenna element 32 is positioned closed to the cavity 33 opening, while not protruding outside the cavity because the pad may be move against the well bore wall during logging operation. Preferably, in particular for measurement in reflection, the antenna element 32 is in contact with the geological formation when the pad 2 is deployed against the borehole wall. However, in certain application, it may be advantageous that the cavity is closed by a cover or window (not shown) in order to retain and protect the dielectric material. Advantageously, the cover is made of a protective material, resistant to abrasion, for example PEEK (thermoplastic PolyEtherEtherKeton). However, any other material that does not perturb high-frequency-wave propagation and shows an appropriate mechanical resistance to abrasion is acceptable.

The antenna element 32 may have a strip shape. As an example, the width of the strip is around 5 mm. The resistance against abrasion, the electric dipole moment, and the sensitivity (in particular sensitivity in reflection in a substantially pure electrical dipole mode EDM) may be improved by increasing the width of the strip.

In the example of FIG. 8, the antennas are oriented such that each antenna element 32 is perpendicular to the pad axis, thus perpendicular to the bore hole axis. This corresponds to a preferred configuration in which the magnetic dipole is parallel to the pad axis. This configuration in a substantially pure magnetic dipole mode MDM enables deeper measurements in the geological formations. However, in certain application, it may be interesting that the antennas are oriented such that the antenna element is in alignment with the pad axis, thus parallel to the bore hole axis (configuration not shown).

Figure 9B:
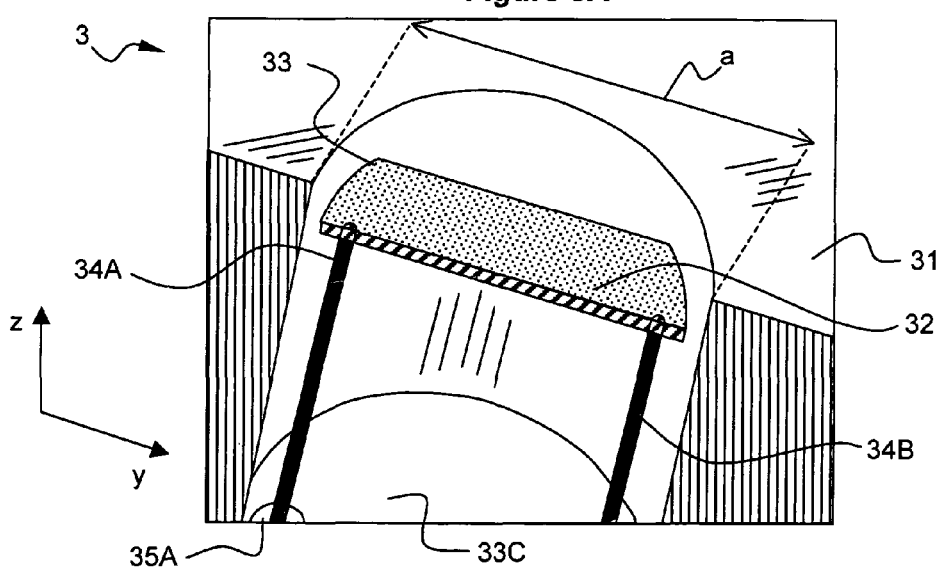

FIGS. 9A and 9B illustrate the antenna 3 according to a first embodiment.

The first 34A and second 34B ports pass through the conductive base 31 by means of first 35A and second 35B openings. The openings 35A, 35B are positioned into the bottom 33C of the cavity straight underneath the antenna element ends. The first 34A and second 34B ports extend into the cavity 33. Advantageously, the ports 34A, 34B are insulated relatively to the conductive base at least when passing through the openings. As an alternative, the openings 35A, 35B are filled with an insulating material in order to insulate the connection wires of the ports relatively to the conductive base and maintain the positioning of the antenna element 32 into the cavity 33.

FIG. 10 illustrates the antenna 3 according to a second embodiment. The first 34A and second 34B ports pass through the conductive base 31 by means of first 36A and second 36B inversed L-shaped tunnels. The tunnels extend from the bottom of the conductive base 31 and emerge into the cavity 33 by the lateral walls 33A, 33B close to the top of the cavity. The antenna element 32 extends all along the cavity aperture. As illustrated in FIG. 10, the antenna element 32 may also extends into a portion of the first 36A and second 36B tunnels. The first 34A and second 34B ports extend into the first 36A and second 36B tunnels. Advantageously, the ports 34A, 34B are insulated relatively to the conductive base 31 all along the tunnels 35A, 35B. Further, the ends of the antenna element 32 when extending into the portion of the first 35A and second 35B tunnels are also insulated relatively to the conductive base 31.

FIG. 11 illustrates the antenna 3 according to a third embodiment. The third embodiment differs from the first one in that the first 35A and second 35B openings positioned into the bottom of the cavity 33 are replaced by a unique opening 37. The unique opening 37 is positioned substantially at the center of the bottom 33C of the cavity 33. Advantageously, the ports 34A, 34B are insulated relatively to the conductive base and relatively to each other at least when passing through the openings.

In the various embodiments, the metallic parts of the antenna may be gold-plated to minimize Ohmic losses. The antenna 3 may be designed under the form of an antenna module inserted into a slot of the pad 2. In this case, the conductive base 31 may advantageously comprise a printed-circuit board (not shown) coupled to the antenna element 32 by means of the port 34A, 34B. The printed-circuit board may comprise an impedance-matching network. The impedance-matching network enables maximizing the power transmitted into the formation when the antenna is a transmitter, or, by reciprocity, the power received when the antenna is a receiver. Advantageously, the printed circuit board and the impedance-matching network are located closely to the antenna element in order to improve its efficiency. For example, the printed-circuit board may be located at a distance inferior to a size of the cavity from the antenna element. Finally, the matching network may be designed for several discrete frequencies with passive components (inductances or capacitances) or active components (variable capacitance). The active components enable operating in a frequency range from 0.01 GHz to 2.0 GHz with a maximized efficiency.

FIGS. 12A and 12B schematically show in greater details the electronic module 4 shown in FIGS. 8, 9, 10 and 11 according to a first and a second embodiment, respectively. One of the electronic module 4 function is to control the mode of operation of the antenna, namely to control that the antenna behaves like a substantially pure magnetic dipole or a substantially pure electric dipole.

FIG. 12A schematically shows in details the electronic module 4 according to the first embodiment. The various elements comprised in the electronic module are shown in greater details in FIGS. 14A, 14B, 16A and 16B.

The ports of the antenna element used as a transmitter T are coupled to a first 41T and a second 42T transmitter module by means of a first switch 40T. The first transmitter module 41T operates the antenna so as to define a substantially pure magnetic dipole. The second transmitter module 42T operates the antenna so as to define a substantially pure electric dipole. The ports of the antenna element used as a receiver R are coupled to a first 41R and a second 42R receiver module by means of a second switch 40R. The first receiver module 41R operates the antenna so as to define a substantially pure magnetic dipole. The second receiver module 42R operates the antenna so as to define a substantially pure electric dipole.

The switches and the various modules are coupled to a control and processing module 43. Depending which mode of operation is chosen, the switch (40T or 40R) commanded by the control and processing module 43 couples the antenna (transmitting T or receiving R antenna) either with the first or with the second module (transmitter or receiver module). The calculation performed by the control and processing module 43 based on the measurements provided by the first or second module (transmitter or receiver module) will be described hereinafter.

FIG. 12B schematically shows in details the electronic module 4 according to the second embodiment. The various elements comprised in the electronic module are shown in greater details in FIGS. 16C and 16D.

The ports of the antenna element used as a transmitter T are coupled to a unique transmitter module 44T. The transmitter module 44T operates the antenna so as to define either a substantially pure magnetic dipole or a substantially pure electric dipole. The ports of the antenna element used as a receiver R are coupled to a unique receiver module 44R. The receiver module 44R operates the antenna so as to define either a substantially pure magnetic dipole or a substantially pure electric dipole. The transmitter 44T and the receiver 44R modules are both coupled to the control and processing module 43. Depending of the chosen mode of operation, the control and processing module 43 commands the mode of operation of the antenna. The calculation performed by the control and processing module 43 based on the measurements provided by the unique module (transmitter or receiver module) will be described hereinafter.

Figure 13:
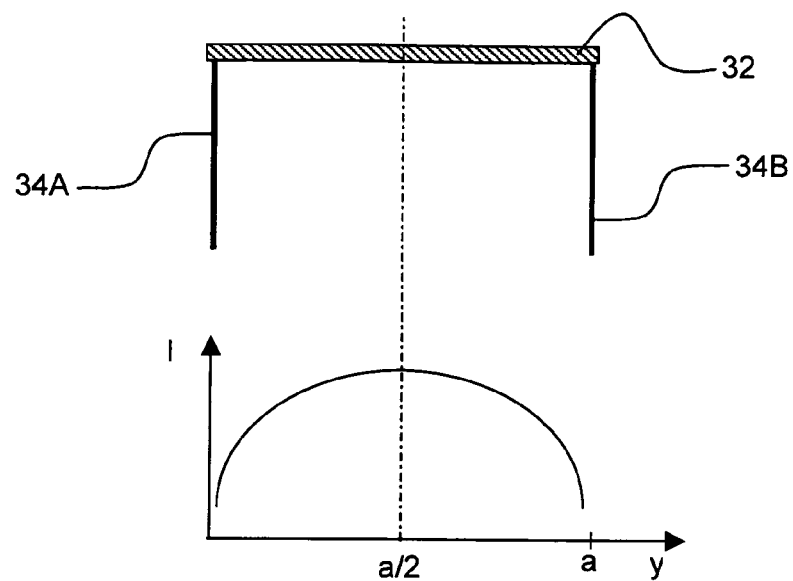
FIG. 13 illustrates the current distribution for an antenna according to the invention operating into a substantially pure magnetic dipole mode.

FIG. 13 illustrates the current distribution I(y) applied to the antenna element 32 via the ports 34A, 34B, the antenna being fitted into a cavity of aperture a. The current distribution is such that the current applied to the antenna increases from one extremity to the middle (a/2) of the antenna element, and then decreases from the middle (a/2) of the antenna element to the other extremity. As examples, the current distribution may be of the parabolic type, or the co-sinusoidal type, etc. . . . . . With such a current distribution, the antenna operates into a substantially pure magnetic dipole mode (MDM).

Figure 14A:
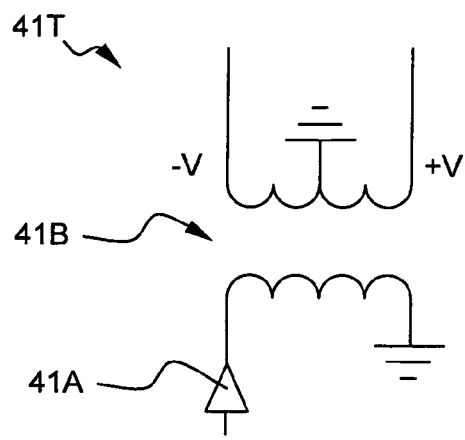
FIGS. 14A and 14B illustrate a first embodiment of a transmitting and a receiving circuit for an antenna according to the invention operating into a substantially pure magnetic dipole mode, respectively.
Figure 14B:
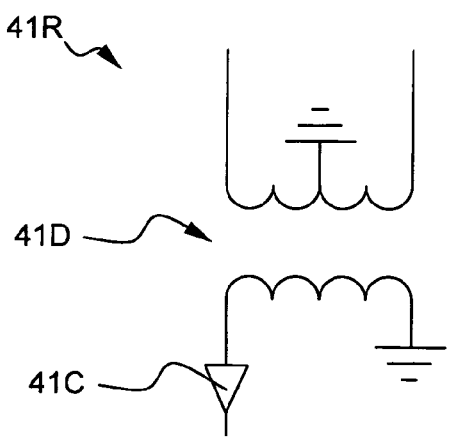

FIGS. 14A and 14B illustrate in details the transmitting 41T and the receiving 41R module for an antenna according to the invention operating into a substantially pure magnetic dipole mode, respectively. The transmitting module 41T and the receiving module 41R are adapted to the electronic module 4 according to the first embodiment as depicted in FIG. 12A.

FIG. 14A illustrates an example of the transmitting module 41T for applying the hereinbefore described current distribution to the antenna element. The transmitting module 41T comprises a power amplifier 41A and a transformer 41B. The output of the amplifier 41A is connected to an input of the primary of the transformer 41B. The other input of the primary of the transformer 41B is connected to a ground. The output of the secondary of the transformer 41B is connected to the first 34A and second 34B ports via the switch 40T. The center of the secondary is also connected to the ground. Thus, a symmetrical voltage +V, −V is applied to each end of the antenna shown in FIG. 13. Therefore, the current distribution shown in FIG. 13 may be given by:

$$J(y) = J_0 \cos\left(k_0\left[y - \frac{a}{2}\right]\right)$$

where:
  $J_0$ is the current amplitude,
  a is the aperture size,
  $k_0$ is the wave number in the cavity and is equal to:

$$k_0 = \frac{\omega}{c}\sqrt{\varepsilon_{cavity}},$$

$\in_{cavity}$ is the relative dielectric constant of the material filling the cavity,
  ω is the angular frequency, and
  c is the speed of light in vacuum.

FIG. 14B illustrates an example of the receiving module 41R. The receiving module 41R comprises a low noise amplifier 41C and a transformer 41D. The input of the amplifier 41C is connected to an output of the secondary of the transformer 41D. The other output of the secondary of the transformer 41D is connected to a ground. The input of the primary of the transformer 41D is connected to the first 34A and second 34B ports via the switch 40R.

FIG. 15 illustrates the current distribution I(y) applied to the antenna element 32 via the ports 34A, 34B, the antenna being fitted into a cavity of aperture a. The current distribution is such that the current applied to the antenna increases from one extremity to the middle (a/2) of the antenna element, and then continue to increase from the middle (a/2) of the antenna element to the other extremity. As examples, the current distribution may be of the linear type, or the sinusoidal type, etc. . . . . With such a current distribution, the antenna operates into a substantially pure electric dipole mode (EDM).

FIGS. 16A and 16B illustrate in details the transmitting 42T and the receiving 42R module for an antenna according to the invention operating into a substantially pure electric dipole mode, respectively. The transmitting module 42T and the receiving module 42R are adapted to the electronic module 4 according to the first embodiment as depicted in FIG. 12A. The transmitting module 42T comprises a power amplifier 42A. The output of the amplifier 42A is connected to the first 34A and second 34B ports via the switch 40T. Thus, the same voltage +V is applied to each end of the antenna shown in FIG. 16.

Therefore, the current distribution shown in FIG. 15 is given by:

$$J(y) = J_0 \sin\left(k_0 \left[y - \frac{a}{2}\right]\right)$$

FIG. 14B illustrates an example of the receiving module 42R. The receiving module 42R comprises a low noise amplifier 42B. The input of the amplifier 42B is connected to the first 34A and second 34B ports via the switch 40R.

FIGS. 16C and 16D illustrate in details the transmitting 44T and the receiving 44R module, the modules being adapted to operate the antenna into either a substantially pure magnetic dipole mode or a substantially pure electric dipole mode. The transmitting module 44T and the receiving module 44R are adapted to the electronic module 4 according to the second embodiment as depicted in FIG. 12B. The second embodiment enables controlling the mode of operation of the antennas through the use of a phase-shifter, in a simpler manner and with less electronic elements than the first embodiment.

The transmitting module 44T comprises a power amplifier 45A. The output of the amplifier 45A is connected to the first port 34A via a phase-shifter 46A. The output of the amplifier 45A is also connected to the second port 34B. Those versed in the art understand that similar result can be achieved when, conversely, the output of the amplifier 45A is connected to the second port 34B via the phase-shifter 46A while the output of the amplifier 45A is connected to the first port 34A. The phase shifter 46A is controlled by the control and processing module 43. When the phase-shifter 46A applies a dephasing of 180° to the signal at the output of the amplifier, then a symmetrical voltage +V, −V is applied to each end of the antenna. Thus, the current distribution in the antenna shown in FIG. 13 is applied and the antenna operates into a substantially pure electric magnetic mode (MDM). When the phase-shifter 46A applies a dephasing of 0° to the signal at the output of the amplifier, then an identical voltage +V is applied to each end of the antenna. Thus, the current distribution in the antenna shown in FIG. 15 is applied and the antenna operates into a substantially pure electric dipole mode (EDM).

The receiving module 44R comprises a low noise amplifier 45B. One of the ports, for example the first port 34A, is connected to the input of the amplifier 45B via a phase-shifter 46B, while the second port 34B is connected the input of the amplifier 45B. Alternatively, as indicated above, the connection relatively to the ports may be inversed. The phase shifter 46B is controlled by the control and processing module 43. When the phase-shifter 46A applies a dephasing of 180° to the signal at the output of one of the port, then the antenna operates into a substantially pure electric magnetic mode (MDM). When the phase-shifter 46A applies a dephasing of 0° to the signal at the output of one of the port, then the antenna operates into a substantially pure electric dipole mode (EDM).

FIGS. 17-20 show the electromagnetic field for an antenna according to the first embodiment. Nevertheless, identical electromagnetic field is observed for the antennas according to the second and third embodiment.

FIG. 17 illustrates the electromagnetic field Ey in the yz plane for an antenna operating according to the substantially pure magnetic dipole mode (MDM). FIG. 18 illustrates the electromagnetic field Ez in the yz plane of an antenna operating according to the substantially pure magnetic dipole mode (MDM).

FIG. 19 illustrates the electromagnetic field Ey in the yz plane for an antenna operating according to the substantially pure electric dipole mode (EDM). FIG. 20 illustrates the electromagnetic field Ez in the yz plane of an antenna operating according to the substantially pure electric dipole mode (EDM).

With the antenna of the invention and contrary to the antenna of the prior art, the radiated electromagnetic field is symmetrical. There are no parasitic modes. Thus, a substantially pure magnetic dipole (FIGS. 17 and 18) and a substantially pure electric dipole (FIGS. 19 and 20) orthogonal to the radiating antenna element are obtained.

The various measurements that can be performed with the antenna of the invention will now be described.

The combination of an antenna element having a simple design coupled to an appropriate current distribution provided by an appropriate electronic circuit enables controlling the mode of operation of the antenna, namely either as a substantially pure magnetic dipole or as a substantially pure electric dipole.

Therefore, the antenna of the invention can replace cross-dipole antenna of the prior art. Further, as the mode of operation or type of the dipole of each antenna (transmitting antenna Tu, Td and receiving antenna Ru, Rd) of the pad can be individually selected, different types of measurement can be performed as illustrated in FIG. 21.

A first type of measurement is the magnetic dipole mode (MDM) measurement where the transmitting Tu, Td and receiving Ru, Rd antennas of the pad are operating as substantially pure magnetic dipoles. This first type of measurement enables a deep radial depth of investigation into the formation.

A second type of measurement is the electric dipole mode (EDM) measurement where the transmitting Tu, Td and receiving Ru, Rd antennas of the pad are operating as substantially pure electric dipoles. This second type of measurement enables a shallow radial depth of investigation into the mudcake when present or into the formation.

A third type of measurement is the cross-fire mode measurement (CFM) where the transmitting antennas Tu, Td of the pad are operating as substantially pure electric dipoles and the receiving antennas Ru, Rd of the pad are operating as substantially pure magnetic dipoles. Reciprocally, the transmitting antennas Tu, Td of the pad are operating as substantially pure magnetic dipoles and the receiving antennas Ru, Rd of the pad are operating as substantially pure electric dipoles. Theoretically, the signal received at the receiving antennas Ru, Rd is zero when the geological formation is homogeneous and isotropic. Thus, when the signal received at the receiving antennas Ru, Rd is not zero, this third type of measurement enables detecting dip, fractures, bed boundaries, vugs or anisotropy in the formation.

The fields and transfer impedances can be expressed as function of the medium properties. The medium may be the formation or the formation covered by a mudcake.

Hence, in a homogeneous medium, the measured attenuation AT and phase-shift PS can be written as function of the wave number k in the medium.

For the magnetic dipole mode (MDM), the medium being the formation, it is given by:

$$AT_{MDM} - jPS_{MDM} = 3\ln\left(\frac{r_2}{r_1}\right) + jk(r_1 - r_2) + \ln\left(\frac{1 - jkr_2}{1 - jkr_1}\right)$$

For the electric dipole mode (EDM), it is given by:

$$AT_{EDM} - jPS_{EDM} = 3\ln\left(\frac{r_2}{r_1}\right) + jk(r_1 - r_2) + \ln\left(\frac{1 - jkr_2 - k^2r_2^2}{1 - jkr_1 - k^2r_1^2}\right)$$

where:
r1 and r2 are the distances between transmitters and receivers,
the wave number is given by:

$$k = \frac{\omega}{c}\sqrt{\mu_r}\sqrt{\varepsilon + j\sigma/\omega\varepsilon_0},$$

$\in$ is the relative medium permittivity,
$\sigma$ is the medium conductivity, and
$\mu_r$ is the relative magnetic permeability, which is assumed to be around 1 in logging application corresponding to the absence of magnetic material.

The antenna of the invention has an impedance depending on the medium dielectric properties, especially in the electric dipole mode (EDM). In this case, the antenna element, e.g. the strip, is preferably in contact with the formation. Thus, it is also possible to determine the medium dielectric properties by measuring a reflection coefficient at a transmitting antenna input. As, this measurement is limited to a shallow zone in front of the transmitting antenna, it is particularly adapted either for measuring the mudcake dielectric properties, or for measuring the formation dielectric properties when no mudcake is present (e.g. in Logging While Drilling LWD application). This type of measurement enables to measure the medium dielectric properties with a fine vertical resolution, e.g. a few millimeters.

Figure 22:
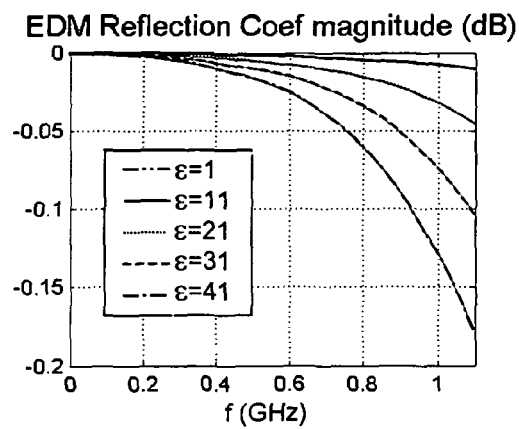
FIGS. 22 and 23 are graphics showing curves representing the reflection coefficient magnitude and the reflection coefficient phase with an antenna according to the invention operating into the substantially pure electric dipole mode and a medium having constant conductivity and a varying permittivity, respectively.
Figure 23:
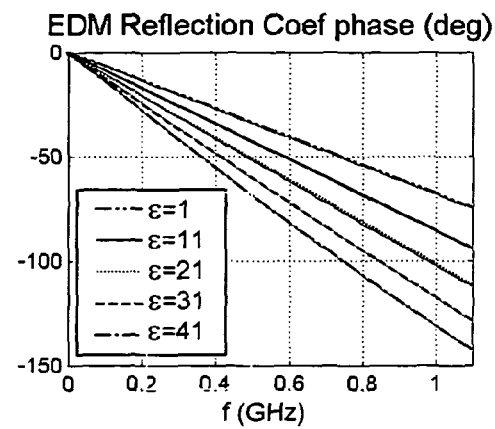
Figure 24:
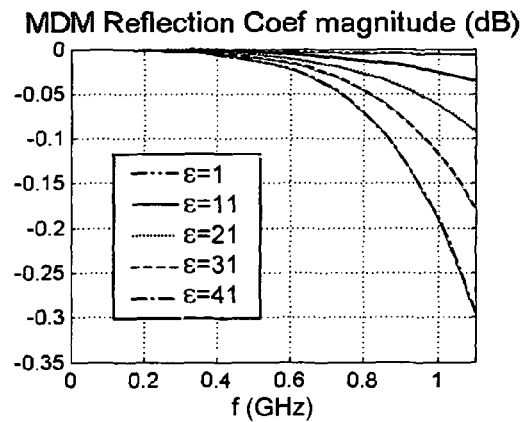
FIGS. 24 and 25 are graphics showing curves representing the reflection coefficient magnitude and the reflection coefficient phase with an antenna according to the invention operating into the substantially pure magnetic dipole mode and a medium having constant conductivity and a varying permittivity, respectively.
Figure 25:
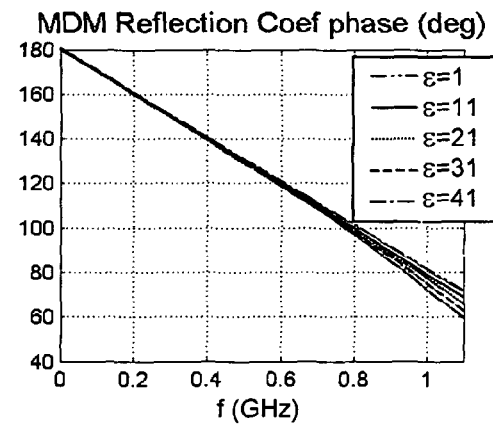

FIGS. 22-25 show curves obtained with a medium having a constant conductivity and a varying permittivity ($\in$ varying from 1 to 41). In particular, FIGS. 22 and 23 show curves representing the reflection coefficient magnitude and the reflection coefficient phase as a function of the frequency with an antenna operating into the substantially pure electric dipole mode (EDM), respectively. FIGS. 24 and 25 show curves representing the reflection coefficient magnitude and the reflection coefficient phase as a function of the frequency with an antenna operating into the substantially pure magnetic dipole mode (MDM), respectively.

Figure 26:
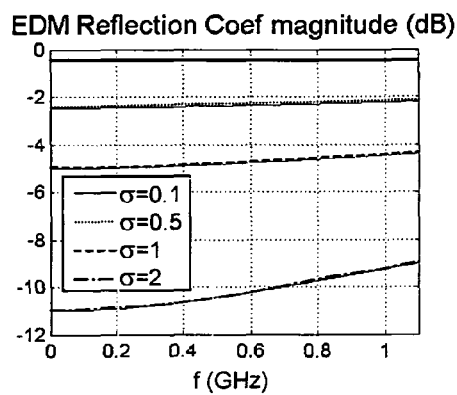
FIGS. 26 and 27 are graphics showing curves representing the reflection coefficient magnitude and the reflection coefficient phase with an antenna according to the invention operating into the substantially pure electric dipole mode and a medium having constant permittivity and a varying conductivity, respectively.
Figure 27:
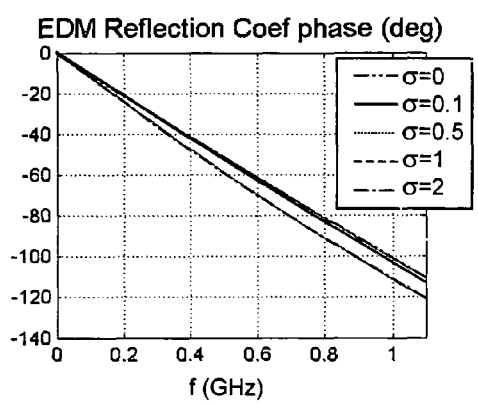
Figure 28:
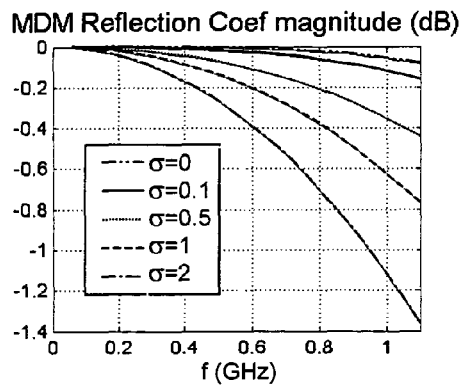
FIGS. 28 and 29 are graphics showing curves representing the reflection coefficient magnitude and the reflection coefficient phase with an antenna according to the invention operating into the substantially pure magnetic dipole mode and a medium having constant permittivity and a varying conductivity, respectively.
Figure 29:
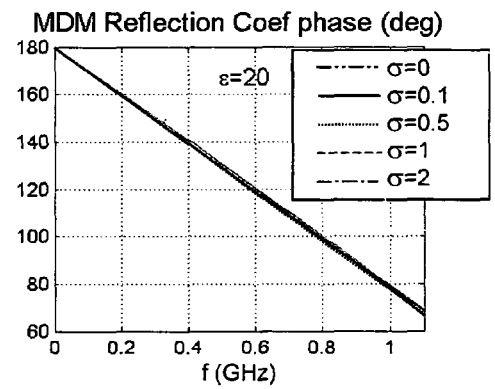

FIGS. 26-29 show curves obtained with a medium having a constant permittivity and a varying conductivity ($\sigma$ varying from 0 to 2 S/m). In particular, FIGS. 26 and 27 show curves representing the reflection coefficient magnitude and the reflection coefficient phase as a function of the frequency with an antenna operating into the substantially pure electric dipole mode (EDM), respectively. FIGS. 28 and 29 show curves representing the reflection coefficient magnitude and the reflection coefficient phase as a function of the frequency with an antenna operating into the substantially pure magnetic dipole mode (MDM), respectively.

The reflection coefficient magnitude is mainly sensitive to the medium conductivity. The reflection coefficient phase is mainly affected by the medium dielectric constant. The application of a simple inversion calculation to the magnitude and phase measurement enables retrieving the dielectric properties of the medium in front of the antenna, namely:

$$\varepsilon^* = \varepsilon + j\frac{\sigma}{\omega\varepsilon_0} \text{ and } \varepsilon^* = 1 + \frac{1 - \Gamma_c}{1 + \Gamma_c} \times \frac{1}{j\omega Z_0 C_0}$$

where
$\in = \text{real}(\in^*)$
$\sigma = \omega\in_0 \text{imag}(\in^*)$ $$\Gamma_c = \frac{\Gamma}{\Gamma_{air}},$$

$\Gamma$ being the reflection coefficient and $\Gamma_{air}$ being the reflection coefficient in the air determined by calibration before logging operations, and
$Z_0C_0$ only depends on the antenna design and is determined by calibration.

Figure 30:
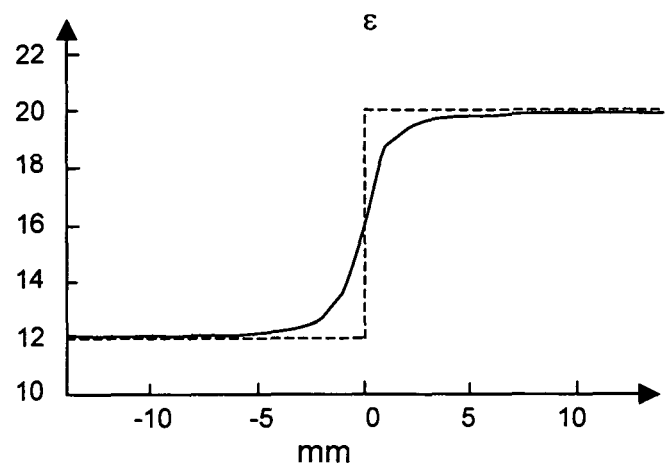
FIGS. 30 and 31 are graphics showing curves representing the permittivity $\in$ and the conductivity $\sigma$ of the formation following an inversion calculation based on measurements with antennas of the invention, respectively.

FIG. 30 shows a curve representing the permittivity $\in$ of the formation following an inversion calculation based on measurements with antennas of the invention. The permittivity of a first media of permittivity $\in_1=12$ and a second media of permittivity $\in_2=20$ is represented by dotted lines. The measured permittivity $\in$ is illustrated by a dotted curve.

Figure 31:
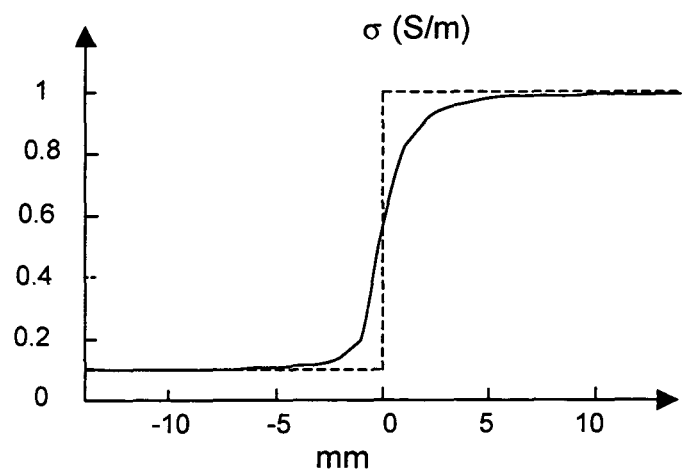

FIG. 31 shows a curve representing the conductivity $\sigma$ of the formation following an inversion calculation based on measurements with antennas of the invention. The conductivity of a first media of conductivity $\sigma_1=0.1$ S/m and a second media of conductivity $\sigma_2=1$ S/m is represented by dotted lines. The measured conductivity $\sigma$ is illustrated by a dotted curve.

In both FIGS. 30 and 31, the coordinate 0 corresponds to the boundary between the first and second media. These curves illustrate that, with the antenna of the invention, the resolution (i.e. the vertical resolution when the antenna is fitted in a logging tool used in a vertical borehole) is around 2 mm.

The hereinbefore commented curves illustrate the good accuracy of the hereinbefore described inversion calculation based on measurements performed with the antenna of the invention. Further, it also enables to measure the medium dielectric properties with a fine vertical resolution.

The antennas of the invention are comprised in an electromagnetic logging apparatus (see FIG. 1). The electromagnetic logging apparatus can implement a method to determine the electromagnetic properties of the medium surrounding the borehole. The structure and operation of such an electromagnetic logging apparatus is described in details in the patent application published under No EP 1 693 685 (filed on 22 Feb. 2005), which is incorporated herein by reference. The electromagnetic probe of the present invention differs from the one of EP 1 693 685 in that it comprises the antennas of the invention as hereinbefore described.

While the logging apparatus is being run through the borehole and the pad engaged with the borehole wall (FIG. 1), electromagnetic signals are radiated into the formation surrounding the borehole by the transmitting antennas Tu, Td. The attenuation and phase-shift of the electromagnetic signals are measured by means of the receiving antennas Ru, Rd.

A method of investigation using the antennas of the invention will now be described, in a logging application where the well bore wall is covered with a mudcake.

In a first step, the antennas are operated into the magnetic dipole mode MDM (cf. table of FIG. 21). These first set of measurements is affected by the medium electromagnetic properties at a deep radial depth of investigation, namely the formation. However, it is still affected by the mudcake electromagnetic properties.

In a second step, the antennas are operated into the electric dipole mode EDM (cf. table of FIG. 21). These second set of measurements comprise a first sub-set of reflection measurement and a second sub-set of transmission measurement. The second set of measurements is affected by the medium electromagnetic properties at a shallow radial depth of investigation, namely mainly the mudcake electromagnetic properties and the mudcake thickness. The second set of measurements enables correcting the first set of measurements for the mudcake electromagnetic properties effect.

With these measurements, it is now possible even in the presence of a mudcake layer to determine the mudcake thickness $t_{mc}$ the permittivity $\in$ and the conductivity $\sigma$ of the mudcake MC ($\in$, $\sigma$)$_{mc}$, and of the formation GF ($\in$, $\sigma$)$_{gf}$, by means of an inversion calculation as hereinbefore described.

FINAL REMARKS

A particular application of the invention relating to a wireline tool has been described. However, it is apparent for a person skilled in the art that the invention is also applicable to a logging-while-drilling tool. A typical logging-while-drilling tool is incorporated into a bottom-hole assembly attached to the end of a drill string with a drill bit attached at the extreme end thereof. Measurements can be made either when the drill string is stationary or rotating. In the latter case an additional measurement is made to allow the measurements to be related to the rotational position of the drill string in the borehole. This is preferably done by making simultaneous measurements of the direction of the earth's magnetic field with a compass, which can be related to a reference measurement made when the drill string is stationary.

It will also be apparent for a person skilled in the art that the invention is applicable to onshore and offshore hydrocarbon well location.

It is apparent that the term "pad" used hereinbefore generically indicates a contacting element with the surface of the borehole wall. The particular contacting element shown in the Figures for maintaining the antennas in engagement with the borehole wall is illustrative and it will be apparent for a person skilled in the art that other suitable contacting element may be implemented, for example a sonde with a backup arm, a centralizer, etc. . . . .

The same remark is also applicable to the particular probe deploying system shown on the Figures.

Finally, it is also apparent for a person skilled in the art that application of the invention to the oilfield industry is not limited as the invention can also be used in others types of geological surveys.

The drawings and their description illustrate rather than limit the invention.

Any reference sign in a claim should not be construed as limiting the claim. The word "comprising" does not exclude the presence of other elements than those listed in a claim. The word "a" or "an" preceding an element does not exclude the presence of a plurality of such element.

The invention claimed is:

1. An antenna (3) of an electromagnetic probe used in investigation of geological formations (GF) surrounding a borehole (WBH) comprising a conductive base (31) and an antenna element (32), the conductive base (31) comprising an opened non-resonant cavity (33), the antenna element (32) being embedded in the cavity (33) and going right through the cavity, the antenna element (32) being isolated from the conductive base (31), the antenna element (32) being coupled to at least one electronic module via a first (34A) and a second (34B) port, respectively, the electronic module configured to apply a current distribution to the antenna element via one or more of the first and second ports, such that the antenna is operated in a substantially pure magnetic dipole when the current distribution is applied to the antenna such that current increases from a first end of the antenna to a middle portion of the antenna, and then decreases from the middle portion of the antenna to a second end of the antenna, and a substantially pure electric dipole when the current distribution is applied to the antenna such that current increases from the first end of the antenna to the second end of the antenna.

2. The antenna of an electromagnetic probe according to claim 1, wherein the antenna element is a wire strip.

3. The antenna of an electromagnetic probe according to claim 1, wherein the cavity (33) has a parallelepipedic or a cylindrical shape.

4. The antenna of an electromagnetic probe according to claim 1, wherein the cavity (33) is filled with a dielectric material.

5. The antenna of an electromagnetic probe according to claim 1, wherein the electronic module comprises a first electronic module (41T, 41R) operating the antenna so as to define a substantially pure magnetic dipole, and wherein the first electronic module comprises an amplifier (41A, 41B) connected to a transformer (41B, 41D), the transformer comprising a secondary having a center connected to a ground, the secondary being connected to the ports of the antenna element.

6. The antenna of an electromagnetic probe according to claim 5, wherein the electronic module comprises a second electronic module (42T, 42R) operating the antenna so as to define a substantially pure electric dipole, and wherein the second electronic module comprises an amplifier (42A, 42B), the amplifier being connected to the ports of the antenna element.

7. The antenna of an electromagnetic probe according to claim 5, wherein the electronic module (44T, 44R) comprises an amplifier (45A, 45B) connected to a phase-shifter (46A, 46B), the phase-shifter being connected to a port of the antenna, the amplifier being also connected to the other port of the antenna element.

8. The antenna of an electromagnetic probe according to claim 5, wherein the amplifier is a power amplifier for an electronic module operating as a transmitter and a low noise amplifier for an electronic module operating as a receiver.

9. The antenna module according to claim 1, wherein the conductive base (31) further comprises a printed circuit board (44) coupled to the antenna by means of the ports, the printed circuit board (44) comprising the at least one electronic module and a control and processing module (43).

10. The antenna module according to claim 9, wherein the printed circuit board (44) further comprises an impedance-matching network and is closely located to the antenna element (32).

11. An electromagnetic logging apparatus used in investigation of geological formations (GF) surrounding a borehole (WBH), comprising:
   a logging tool (TL) moveable through the borehole,
   an electromagnetic probe (1) comprising a pad (2) mounted on the logging tool (TL), adapted for engagement with the borehole wall (WBW) by a wall-engaging face of the pad,
   at least one antenna (Tu, Td) mounted in the wall-engaging face and used as a transmitting antenna,
   a plurality of spaced antennas (Ru, Rd) mounted in the wall-engaging face and used as receiving antennas positioned in spaced relation to the transmitting antenna (Tu, Td),
   a transmitter module (4T) adapted for energizing the transmitting antenna to transmit electromagnetic energy into the formations at a determined frequency, wherein the transmitter module is configured to operate the at least one antenna in a substantially pure magnetic dipole by applying a current distribution to the at least one antenna such that the current increases from a first end of the antenna to a middle portion of the antenna, and then decreases from the middle portion of the antenna to a second end of the antenna, and wherein the transmitter module is configured to operate the at least one antenna in a substantially pure electric dipole by applying a current distribution to the at least one antenna such that current increases from the first end of the antenna to the second end of the antenna, and
   a receiver module (4R) adapted for receiving and processing an output signal at each of the receiving antennas representative of electromagnetic energy received from the formations.

12. A method of investigation of geological formations (GF) surrounding a borehole (WBH) using an electromagnetic logging apparatus comprising at least one transmitting antenna (Tu, Td) and at least one receiving antenna (Ru, Rd), wherein the method comprises the steps of:
   a) running the logging apparatus through the borehole and engaging a pad with a borehole wall so as to define a selected zone made of a medium to be investigated,
   b) performing a first set of measurements at a deep radial depth of investigation in the selected zone by:
      b1) operating the antennas so that each antenna defines a substantially pure magnetic dipole (MDM), and radiating electromagnetic signals in the medium, wherein the antennas are operated in the MDM when a current distribution applied to each antenna increases from a first end of the antenna to a middle portion of the antenna, and then decreases from the middle portion of the antenna to a second end of the antenna,
      b2) measuring a first set of attenuation and phase shift of the electromagnetic signals having traveled in the medium between the transmitting and receiving antennas,
   c) performing a second set of measurements at a shallow radial depth of investigation in the selected zone by:
      c1) operating the antennas so as each antenna defines a substantially pure electric dipole (EDM), wherein the antennas are operated in EDM when a current distribution applied to each antenna increases from the first end of the antenna to the second end of the antenna,
      c2) radiating electromagnetic signals into the formation surrounding the borehole and measuring a first sub-set of attenuation and phase shift of the electromagnetic signals having traveled in the formation between the transmitting and receiving antennas,
      c3) radiating electromagnetic signals into the formation surrounding the borehole and measuring a second sub-set of magnitude and phase of the electromagnetic signals reflected by the formation at a transmitting antenna input, and
   d) performing an inversion calculation based on the first and second set of measurements and determining a permittivity $\in$ and a conductivity $\sigma$ of the in the selected zone.

13. The method of investigation according to claim 12, wherein the medium comprises a geological formation covered by a mudcake, and the step d) comprises performing an inversion calculation based on the first and second set of measurements and determining the permittivity $\in$ and the conductivity $\sigma$ of the formation, the permittivity $\in$, the conductivity $\sigma$ and thickness $t_{mc}$ of the mudcake.

14. The method of investigation according to claim 12, wherein the selected zone comprises at least one geological feature, and wherein the method further comprises the steps of:
   operating the transmitting antennas so that each transmitting antenna defines a substantially pure electric dipole (CFM),
   operating the receiving antennas so that each receiving antenna defines a substantially pure magnetic dipole (CFM),
   radiating electromagnetic signals in the selected zone,
   measuring the attenuation and phase shift of the electromagnetic signals having traveled in the formation between the transmitting and receiving antennas, and
   deducing the geological feature in the selected zone based on the attenuation and phase shift.

15. The method of investigation according to claim 12, wherein the selected zone comprises at least one geological feature, and wherein the method further comprises the steps of:
   operating the transmitting antennas so that each transmitting antenna defines a substantially pure magnetic dipole (CFM),
   operating the receiving antennas so that each receiving antenna defines a substantially pure electric dipole (CFM),
   radiating electromagnetic signals in the selected zone,
   measuring the attenuation and phase shift of the electromagnetic signals having traveled in the formation between the transmitting and receiving antennas, and
   deducing the geological feature in the selected zone based on the attenuation and phase shift.

16. The method of investigation according to claim 14, wherein the geological feature is a laminate, a fracture, a bed boundary or a vug.

* * * * *